United States Patent
Inoue et al.

(10) Patent No.: US 11,772,226 B2
(45) Date of Patent: Oct. 3, 2023

(54) POLISHING APPARATUS

(71) Applicant: DISCO CORPORATION, Tokyo (JP)

(72) Inventors: Yuki Inoue, Tokyo (JP); Takamasa Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1195 days.

(21) Appl. No.: 16/376,274

(22) Filed: Apr. 5, 2019

(65) Prior Publication Data
US 2019/0314950 A1    Oct. 17, 2019

(30) Foreign Application Priority Data

Apr. 13, 2018 (JP) ................................. 2018-077495

(51) Int. Cl.

| | |
|---|---|
| B24B 37/005 | (2012.01) |
| B24B 37/04 | (2012.01) |
| B24B 49/04 | (2006.01) |
| B24B 41/06 | (2012.01) |
| B24B 37/30 | (2012.01) |
| H01L 21/306 | (2006.01) |
| H01L 21/304 | (2006.01) |

(52) U.S. Cl.
CPC ............ B24B 37/005 (2013.01); B24B 37/04 (2013.01); B24B 37/30 (2013.01); B24B 41/061 (2013.01); B24B 49/04 (2013.01); H01L 21/304 (2013.01); H01L 21/30625 (2013.01)

(58) Field of Classification Search
None
See application file for complete search history.

(56) References Cited

U.S. PATENT DOCUMENTS

| | | | | | |
|---|---|---|---|---|---|
| 5,816,900 | A | * | 10/1998 | Nagahara | B24B 57/02 451/60 |
| 5,931,722 | A | * | 8/1999 | Ohmi | B24B 37/04 451/271 |
| 6,241,586 | B1 | * | 6/2001 | Yancey | C09G 1/02 451/36 |
| 6,300,247 | B2 | * | 10/2001 | Prabhu | B24B 53/017 438/692 |
| 6,322,422 | B1 | * | 11/2001 | Satou | B24B 37/005 451/283 |

(Continued)

FOREIGN PATENT DOCUMENTS

| | | |
|---|---|---|
| DE | 102019204883 A1 | 10/2019 |
| JP | 10339330 A | 12/1998 |
| JP | 2015134383 A | 7/2015 |

OTHER PUBLICATIONS

DE 10 2019 205 232.0: Translation of German Office Action dated Oct. 27, 2022 (8 pages).

*Primary Examiner* — Sylvia MacArthur
(74) *Attorney, Agent, or Firm* — Greer, Burns & Crain, Ltd.

(57) ABSTRACT

A polishing apparatus includes a holding table having a holding surface that holds a wafer, a polishing unit in which a polishing pad having an opening at the center of a polishing surface that polishes the wafer is mounted to a spindle and is rotated, a slurry supply unit that supplies slurry to the polishing surface of the polishing pad, and an air supply unit that shuts an upper end of a penetrating path penetrating through the axial center of rotation of the polishing pad and the spindle and supplies air into the penetrating path.

7 Claims, 3 Drawing Sheets

(56) References Cited

U.S. PATENT DOCUMENTS

| | | | |
|---|---|---|---|
| 6,749,714 B1* | 6/2004 | Ishikawa | B24B 37/205 |
| | | | 156/345.12 |
| 2004/0259486 A1 | 12/2004 | Torii et al. | |
| 2005/0260929 A1* | 11/2005 | Shiho | B24B 37/26 |
| | | | 451/41 |
| 2011/0021115 A1* | 1/2011 | Oh | B24B 37/04 |
| | | | 451/10 |
| 2011/0053474 A1* | 3/2011 | Moriya | B24B 37/30 |
| | | | 451/288 |
| 2012/0064800 A1* | 3/2012 | Watanabe | B24B 37/005 |
| | | | 451/5 |
| 2013/0143474 A1* | 6/2013 | Wang | B24B 57/02 |
| | | | 451/60 |
| 2014/0190633 A1* | 7/2014 | Maeda | H01L 21/67051 |
| | | | 134/103.3 |
| 2015/0239089 A1* | 8/2015 | Hirayama | B24B 57/02 |
| | | | 451/59 |
| 2015/0328743 A1* | 11/2015 | Nabeya | B24B 41/007 |
| | | | 451/288 |
| 2017/0252895 A1* | 9/2017 | Yamaguchi | B24B 53/017 |
| 2018/0050436 A1* | 2/2018 | Yamanaka | B24B 37/107 |
| 2019/0181022 A1* | 6/2019 | Mouri | H01L 21/68742 |
| 2019/0314950 A1* | 10/2019 | Inoue | H01L 21/30625 |
| 2020/0306931 A1* | 10/2020 | Lianto | H01L 21/02074 |

\* cited by examiner

POLISHING APPARATUS

BACKGROUND OF THE INVENTION

Field of the Invention

The present invention relates to a polishing apparatus that polishes a wafer.

Description of the Related Art

A polishing apparatus that polishes a wafer (for example, refer to Japanese Patent Laid-open No. 2015-134383) includes a chuck table that sucks and holds the wafer by a holding surface and can rotate around the center of the holding surface, a rotation mechanism that rotates the chuck table around the center of the holding surface, a polishing unit having a spindle rotated around the center of a mount to which a polishing pad is mounted, and a slurry supply unit that supplies slurry from an opening formed at the center of the polishing pad through a penetrating path formed to penetrate through the axial center of the spindle. While supplying the slurry from the opening at the center of the polishing pad, the polishing apparatus polishes the wafer in such a manner as to spread the slurry over the whole polishing surface by the centrifugal force of the rotating polishing pad.

SUMMARY OF THE INVENTION

However, in a polishing apparatus like that described in Japanese Patent Laid-open No. 2015-134383, when an amount of supplied slurry is small with respect to the rotation speed of the polishing pad, the slurry does not spread to the outer circumferential side by only the centrifugal force, and as a result, polishing is carried out in the state in which the slurry does not spread over the whole polishing surface of the polishing pad. Therefore, the amount of supplied slurry is set large with respect to the rotation speed of the polishing pad, and polishing is carried out while the slurry is spread over the whole polishing surface by the centrifugal force. However, this is uneconomic in some cases.

Thus, an object of the present invention is to provide a processing apparatus that can implement economic polishing processing with suppression of the consumption of slurry.

In accordance with an aspect of the present invention, there is provided a polishing apparatus including a holding table having a holding surface that holds a wafer, a polishing unit in which a polishing pad having an opening at a center of a polishing surface that polishes the wafer held by the holding table is mounted to a spindle and is rotated, a slurry supply unit that supplies slurry to the polishing surface of the polishing pad, and an air supply unit that shuts an upper end of a penetrating path penetrating through an axial center of rotation of the polishing pad and the spindle and supplies air into the penetrating path. The air supplied by the air supply unit is sprayed onto an upper surface of the wafer that closes the opening of the polishing pad through bringing the upper surface of the wafer held by the holding table into contact with the polishing surface of the polishing pad. The wafer is polished in such a manner that the slurry supplied from the slurry supply unit is spread over the whole of the polishing surface due to a flow of the air in a radial manner from the opening toward an outer circumference in a polishing surface direction of the polishing pad.

It is preferable that the slurry supply unit be a mist slurry supply unit that sprays mist slurry obtained by mixing slurry and air onto a part protruding from the wafer in the polishing surface when the polishing pad with the polishing surface larger than the upper surface of the wafer is mounted to the spindle and the polishing surface is brought into contact with the upper surface of the wafer held by the holding surface.

The slurry supply unit may be a penetrating path slurry supply unit that supplies slurry to the penetrating path.

The polishing apparatus according to one aspect of the present invention includes the air supply unit that shuts the upper end of the penetrating path penetrating through the axial center of rotation of the polishing pad and the spindle and supplies the air into the penetrating path. Furthermore, the air supplied by the air supply unit is sprayed onto the upper surface of the wafer that closes the opening of the polishing pad through bringing the upper surface of the wafer held by the holding table into contact with the polishing surface of the polishing pad. Moreover, the wafer is polished in such a manner that the slurry supplied from the slurry supply unit is spread over the whole of the polishing surface due to the flow of the air in a radial manner from the opening toward the outer circumference in the polishing surface direction of the polishing pad. Due to this, it becomes possible to carry out proper polishing on the wafer with a small amount of slurry, and economic polishing processing with suppression of the consumption of the slurry can be implemented.

As the slurry supply unit, the mist slurry supply unit is employed that sprays the mist slurry obtained by mixing slurry and air onto the part protruding from the wafer in the polishing surface when the polishing pad with the polishing surface larger than the upper surface of the wafer is mounted to the spindle and the polishing surface is brought into contact with the upper surface of the wafer held by the holding surface. Furthermore, the wafer is polished in such a manner that the slurry supplied from the mist slurry supply unit is spread over the whole of the polishing surface due to the flow of the air in a radial manner from the opening toward the outer circumference in the polishing surface direction of the polishing pad. Due to this, it becomes possible to carry out proper polishing on the wafer with a small amount of slurry and economic polishing processing with suppression of the consumption of the slurry can be implemented.

Furthermore, conventionally, in order to measure the thickness of a wafer that is being polished, an area in which slurry does not exist is formed on the upper surface of the wafer directly below the penetrating path. Moreover, the area is irradiated with measurement light (laser light) from an optical displacement sensor, and reflected light from the wafer is received by the optical displacement sensor to measure the thickness of the wafer contactlessly. However, when the amount of slurry supplied to the penetrating path is large as in the conventional technique, there is a problem that the penetrating path is filled with the slurry and it is impossible to irradiate the upper surface of the wafer with the measurement light in some cases. In contrast, due to spraying and supplying of the mist slurry obtained by mixing slurry and air onto the part protruding from the wafer in the polishing surface by the mist slurry supply unit without using the penetrating path, the above-described problem does not occur, and the thickness measurement of the wafer is also enabled.

Also, when the penetrating path slurry supply unit that supplies slurry to the penetrating path is employed as the slurry supply unit, the air supplied by the air supply unit is sprayed onto the upper surface of the wafer that closes the opening of the polishing pad through bringing the upper surface of the wafer held by the holding table into contact with the polishing surface of the polishing pad. Furthermore, the flow of the air in a radial manner from the opening toward the outer circumference in the polishing surface direction of the polishing pad is generated, and the wafer is polished in such a manner that the slurry supplied from the slurry supply unit is spread over the whole of the polishing surface by this flow of the air. Due to this, it becomes possible to carry out proper polishing on the wafer with a small amount of slurry and economic polishing processing with suppression of the consumption of the slurry can be implemented. Moreover, because the amount of slurry supplied to the penetrating path can be reduced, filling the penetrating path with the slurry is eliminated and the contactless thickness measurement of the wafer by use of the optical displacement sensor or the like can be achieved more surely.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
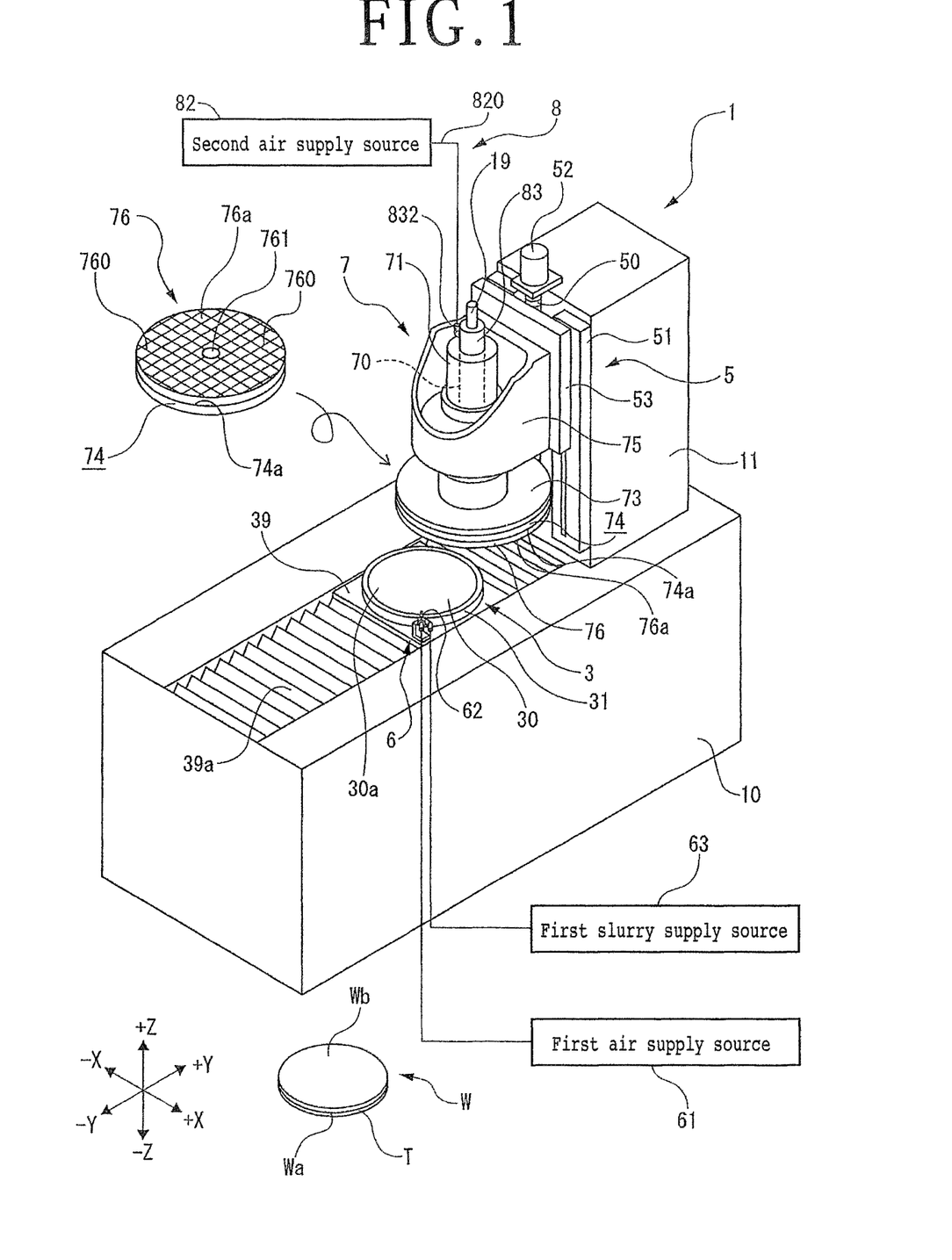
FIG. 1 is a perspective view illustrating one example of a polishing apparatus including a mist slurry supply unit.

A polishing apparatus 1 illustrated in FIG. 1 is an apparatus that polishes a wafer W held on a holding table 3 by a polishing pad 76 mounted to a spindle 70 having the axial center along the vertical direction (Z-axis direction) and includes an apparatus base 10 that extends in a Y-axis direction and a column 11 disposed upright on the rear part side in the Y-axis direction on the apparatus base 10.

The wafer W illustrated in FIG. 1 is a semiconductor wafer that is composed of silicon or the like and has a circular plate shape as the outer shape, for example, and an upper surface Wb oriented upward in FIG. 1 becomes a polished surface. Plural devices are formed on a lower surface Wa of the wafer W oriented downward in FIG. 1, for example. A protective tape T is stuck to the lower surface Wa and the plural devices are protected. The wafer W is not limited to the example illustrated in the present embodiment.

The diameter of the wafer W is 300 mm or 200 mm, for example.

The holding table 3 having a circular shape as the outer shape includes a suction adhesion part 30 that is formed of a porous member or the like and causes adhesion of the wafer W by suction and a frame body 31 that supports the suction adhesion part 30. The suction adhesion part 30 communicates with a suction source (not illustrated) such as a vacuum generating apparatus. A suction force generated through suction by the suction source is transmitted to a holding surface 30a that is an exposed surface of the suction adhesion part 30 and thereby the holding table 3 can suck and hold the wafer W on the holding surface 30a.

Furthermore, the holding table 3 can rotate around the axial center along the Z-axis direction by a rotation mechanism (rotation means) (not illustrated) that is surrounded by a cover 39 and is disposed below the holding table 3.

Below the holding table 3, the cover 39, and an accordion cover 39a joined to the cover 39, a movement mechanism (movement means) (not illustrated) that moves the holding table 3 and the cover 39 in the Y-axis direction is disposed. The accordion cover 39a expands and contracts in the Y-axis direction in association with movement of the holding table 3 and the cover 39.

On the front surface of the column 11, a polishing feed mechanism (polishing feed means) 5 that causes polishing feed of a polishing unit (polishing means) 7 in the Z-axis direction in which the polishing unit 7 gets further away from or closer to the holding table 3 is disposed. The polishing feed mechanism 5 includes a ball screw 50 having the axial center along the Z-axis direction, a pair of guide rails 51 disposed in parallel to the ball screw 50, a motor 52 that is joined to the upper end of the ball screw 50 and rotates the ball screw 50, a lifting-lowering plate 53 whose inside nut is screwed to the ball screw 50 and whose side parts are in sliding contact with the guide rails 51. When the motor 52 rotates the ball screw 50, the lifting-lowering plate 53 is guided by the guide rails 51 to reciprocate in the Z-axis direction in association with this rotation and polishing feed of the polishing unit 7 fixed to the lifting-lowering plate 53 is carried out in the Z-axis direction.

The polishing unit 7 includes the spindle 70 whose axial direction is the Z-axis direction, a housing 71 that rotatably supports the spindle 70, a motor 72 (see FIG. 2) that rotationally drives the spindle 70, and a mount 73 that is connected to the lower end of the spindle 70 and has a circular plate shape. The polishing unit 7 further includes a platen 74 that is mounted to the lower surface of the mount 73 and has a circular plate shape, the polishing pad 76 attached to a bonding surface 74a of the platen 74, and a holder 75 that supports the housing 71 and has a side surface fixed to the lifting-lowering plate 53 of the polishing feed mechanism 5.

Figure 2:
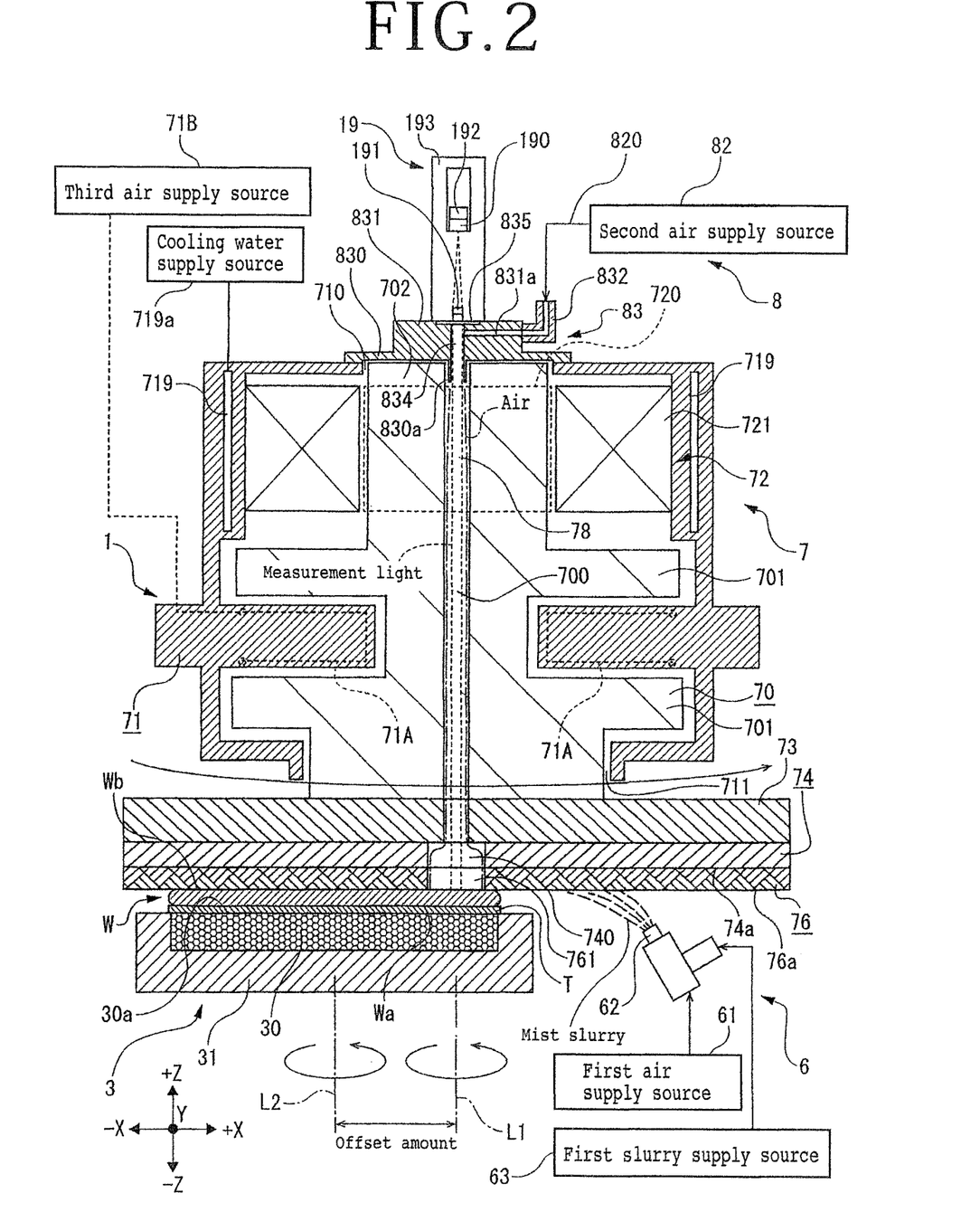
FIG. 2 is a sectional view illustrating one example of the polishing apparatus including the mist slurry supply unit.

As illustrated in FIG. 2, in the housing 71 whose outer shape is formed into a substantially circular cylindrical shape, for example, an air bearing 71A that contactlessly supports the spindle 70 by the pressure of air supplied from a third air supply source 71B is disposed. The air bearing 71A contactlessly supports the spindle 70 by air ejected from an inner wall of the housing 71 to the spindle 70 from the radial direction and the thrust direction.

For example, the height position of the upper surface of the housing 71 and the height position of the upper end surface of the spindle 70 disposed inside the housing 71 are substantially the same height position and a state in which the upper end surface of the spindle 70 does not protrude outward from an opening 710 formed in the upper surface of the housing 71 is made. Furthermore, from an opening 711 of the lower surface of the housing 71, the lower end side of the spindle 70 protrudes from the inside of the housing 71.

For example, the spindle 70 contactlessly supported in the housing 71 includes a long shaft part 702 that extends in the Z-axis direction and two flange parts 701 that are formed monolithically with the long shaft part 702 and are extended outward in the radial direction from the long shaft part 702 at the lower end side and a middle part of the long shaft part 702. The contactless support of the spindle 70 in the housing 71 is enabled by air layers formed by the air (ejected air)

supplied from the third air supply source 71B between the upper and lower surfaces of the respective flange parts 701 and the air bearing 71A.

As illustrated in FIG. 2, inside the spindle 70 and the mount 73, a flow path 700 that passes through the rotation center of each and serves as a passage of air is formed to penetrate in the Z-axis direction.

For example, the motor 72 includes a rotor 720 connected to the upper end side of the long shaft part 702 of the spindle 70 and a stator 721 fixed to the inner surface of the housing 71 in such a manner as to be opposed to the outer circumferential side of the rotor 720. A power supply (not illustrated) is connected to the stator 721. The rotor 720 rotates due to the stator 721 provided with power from the power supply, and the spindle 70, to which the rotor 720 is mounted, also rotates in association with this.

For example, as illustrated in FIG. 2, a ring-shaped water flow path 719 is formed to surround the motor 72 at the place adjacent to the stator 721 inside the sidewall of the housing 71 (upper part of the housing 71 in FIG. 2). Furthermore, cooling water is made to flow into the water flow path 719 from a cooling water supply source 719a that communicates with the water flow path 719. This cooling water contactlessly cools the motor 72 from the surroundings through the sidewall of the housing 71 and then is drained to the outside of the housing 71 from a drainage port (not illustrated) and is further circulated for cooling.

The platen 74 has substantially the same diameter as the mount 73 and a through-hole 740 serving as a flow path of air is formed at the central part thereof. Furthermore, the polishing pad 76 is bonded to the bonding surface 74a of the platen 74 by an adhesive or the like. The platen 74 is mounted to the mount 73 by using a fixing bolt (not illustrated) or the like in a state in which the center of the flow path 700 of the mount 73 is made to substantially correspond with the center of the through-hole 740 of the platen 74. For example, the through-hole 740 of the platen 74 has a larger diameter than the flow path 700 of the mount 73. However, the configuration is not limited thereto.

The polishing pad 76 is formed of unwoven fabric such as felt, for example, and an opening 761 through which air passes and that corresponds to the through-hole 740 of the platen 74 is formed to penetrate at the central part. The diameter of the polishing pad 76 is equivalent to the diameter of the platen 74 and is larger than the diameter of the wafer W held by the holding table 3. For example, when the diameter of the wafer W to be polished is 300 mm, the diameter of the polishing pad 76 is set to 600 mm. When the diameter of the wafer W to be polished is 200 mm, the diameter of the polishing pad 76 is set to 400 mm.

A penetrating path 78 that penetrates through the axial center of rotation of the polishing pad 76 and the spindle 70 and through which air flows is formed by the flow path 700 passing through the spindle 70 and the mount 73, the through-hole 740 of the paten 74, and the opening 761 of the polishing pad 76.

As illustrated in FIG. 1, grooves 760 in a lattice manner are formed in a polishing surface 76a that abuts against the wafer W in the polishing pad 76, and slurry supplied to the polishing pad 76 flows mainly in the grooves 760 and spreads.

As illustrated in FIG. 2, the polishing apparatus 1 includes an air supply unit (air supply means) 8 that shuts the upper end of the penetrating path 78 penetrating through the axial center of rotation of the polishing pad 76 and the spindle 70 (upper end of the flow path 700 of the spindle 70) and supplies air into the penetrating path 78.

For example, the air supply unit 8 includes a second air supply source 82 formed of a compressor, an air reservoir tank, and so forth and a shutting member 83 that communicates with the second air supply source 82 through a conduit line 820 and is disposed above the spindle 70 in such a manner as to shut the penetrating path 78.

For example, the shutting member 83 includes a plate part 830 that is formed to be larger than the opening 710 of the housing 71 and is detachably fixed to the upper surface of the housing 71 in such a manner as to close the upper end of the flow path 700 of the spindle 70 and the opening 710, a column part 831 disposed upright from the center of the upper surface of the plate part 830, and a joint 832 connected to the conduit line 820 attached to the side surface of the column part 831.

At the center of the shutting member 83, a through-hole 834 is formed to penetrate along the thickness direction (Z-axis direction). Furthermore, in the column part 831, an air introduction path 831a leading to the through-hole 834 is formed along the horizontal direction and the air introduction path 831a communicates with the joint 832.

A pipe 830a leading to the through-hole 834 is formed on the lower surface of the plate part 830, and the state in which this pipe 830a is inserted in the penetrating path 78 is made.

The upper end side of the through-hole 834 of the column part 831 is sealed by a transmissive plate 835 formed of a transparent member (for example, glass member) that allows measurement light for measuring the thickness of the wafer W in polishing processing to be transmitted therethrough.

For example, a thickness measurement unit (thickness measurement means) 19 for measuring the thickness of the wafer W in polishing processing is disposed on the upper surface of the column part 831 of the shutting member 83. The thickness measurement unit 19 is an optical displacement sensor of a reflective type, for example. The thickness measurement unit 19 includes a light projecting part 190 for irradiating the wafer W with measurement light, a collimator lens 191 that converts the measurement light to collimated light, a light receiving part 192 formed of a charge-coupled device (CCD) or the like for detecting reflected light arising from reflection by the wafer W, and a casing 193 inside which the light projecting part 190, the collimator lens 191, the light receiving part 192, and so forth are disposed and that is shielded from external light.

Operation of the polishing apparatus 1 in the case of polishing the wafer W (for example, the diameter is 300 mm) illustrated in FIG. 1 by the polishing apparatus 1 will be described below.

In such a manner that the center of the wafer W substantially corresponds with the center of the holding surface 30a of the holding table 3, the wafer W is placed on the holding surface 30a with the upper surface Wb oriented upward. Then, a suction force generated through driving of the suction source (not illustrated) is transmitted to the holding surface 30a, and the holding table 3 sucks and holds the wafer W on the holding surface 30a.

The holding table 3 that holds the wafer W moves in the +Y direction to a location below the polishing unit 7 by the movement mechanism (not illustrated) and position alignment between the polishing pad 76 (for example, the diameter is 600 mm) and the wafer W is carried out. In the present embodiment, the holding table 3 is positioned to a predetermined position to always obtain a state in which the polishing pad 76 abuts against the whole of the upper surface Wb of the wafer W and the opening 761 of the polishing pad 76 is closed by the upper surface Wb of the wafer W in polishing processing. Furthermore, as illustrated in FIG. 2, the distance in the horizontal direction between a virtual line L1 representing the rotation center of the polishing pad 76 and a virtual line L2 representing the rotation center of the holding table 3 (so-called offset amount) is set to 125 mm. When the diameter of the wafer W is 200 mm and the diameter of the polishing pad 76 is 400 mm, the offset amount is set to 75 mm.

Subsequently, the polishing pad 76 rotates in association with rotational driving of the spindle 70 by the motor 72 at a predetermined rotation speed (for example, 1000 rpm to 2000 rpm). Furthermore, the polishing unit 7 is sent in the −Z direction by the polishing feed mechanism 5, and the polishing surface 76a of the polishing pad 76 abuts against the upper surface Wb of the wafer W. Thereby, the polishing processing is carried out. Moreover, in the polishing processing, the rotation mechanism (not illustrated) rotates the holding table 3 around the axial center along the Z-axis direction at a predetermined rotation speed (for example, 300 rpm to 1250 rpm). In association with this, the wafer W held on the holding surface 30a also rotates and the polishing pad 76 carries out the polishing processing of the whole of the upper surface Wb of the wafer W.

In the above polishing processing, slurry is supplied to the contact part between the wafer W and the polishing pad 76. The polishing apparatus 1 includes a slurry supply unit (slurry supply means) that supplies the slurry to the polishing surface 76a of the polishing pad 76. For example, as illustrated in FIGS. 1 and 2, the slurry supply unit in the present embodiment is a mist slurry supply unit 6 that sprays mist slurry obtained by mixing the slurry and air onto a part protruding from the wafer W in the polishing surface 76a when the polishing pad 76 with the polishing surface 76a (for example, the diameter of the polishing surface 76a is 600 mm) larger than the upper surface Wb (for example, the diameter of the upper surface Wb is 300 mm) that is the polished surface of the wafer W is mounted to the spindle 70 and the polishing surface 76a is brought into contact with the upper surface Wb of the wafer W held by the holding surface 30a of the holding table 3.

As illustrated in FIG. 2, for example, the mist slurry supply unit 6 includes a nozzle 62 that sprays the slurry in a mist form, a first air supply source 61 that communicates with the nozzle 62, and a first slurry supply source 63 that communicates with the nozzle 62. For example, the spray port of the nozzle 62 is opposed to a central region of the polishing surface 76a of the polishing pad 76, i.e. the vicinity of the opening 761 of the polishing surface 76a, from an oblique lower side.

The mist slurry supply unit 6 is disposed near the holding table 3, for example, on the upper surface of the cover 39 illustrated in FIG. 1. As illustrated in FIG. 2, when the holding table 3 is positioned below the polishing unit 7, the mist slurry supply unit 6 is also positioned at a predetermined position below the polishing unit 7.

A disposition place of the mist slurry supply unit 6 is not limited to the upper surface of the cover 39. For example, the mist slurry supply unit 6 may be disposed near the lower side of the polishing unit 7 on the upper surface of the apparatus base 10 and be capable of pivoting by a pivot mechanism (pivot means) in the horizontal direction around the axial center along the Z-axis direction. Furthermore, after the holding table 3 is positioned below the polishing unit 7, the mist slurry supply unit 6 may be positioned in such a manner that the tip of the nozzle 62 is opposed to the lower surface of the polishing pad 76 of the polishing unit 7 due to pivotal movement of the mist slurry supply unit 6.

As illustrated in FIG. 2, the second air supply source 82 supplies compressed air to the conduit line 820 at a predetermined supply rate (for example, 30 L/minute to 50 L/minute). This air flows in the joint 832, the air introduction path 831a, the through-hole 834, and the penetrating path 78 and is sprayed onto the upper surface Wb of the wafer W that closes the opening 761 of the polishing pad 76 and rotates. Moreover, the air sprayed onto the upper surface Wb of the wafer W flows toward the outer circumferential side of the polishing pad 76 mainly along the grooves 760 in a lattice manner in the polishing surface 76a. In addition, because the polishing pad 76 rotates at a predetermined rotation speed in the polishing processing, the flow of the air on the polishing surface 76a is a radial flow from the opening 761 toward the outer circumference in the polishing surface direction of the polishing pad 76 (horizontal direction) when viewed from the +Z direction side.

While such air supply by the air supply unit 8 is carried out, the first slurry supply source 63 supplies the slurry (for example, slurry containing $SiO_2$, $Al_2O_3$, or the like as loose abrasive grains) to the nozzle 62 at a predetermined supply rate (for example, 30 mL/minute). In addition, compressed air is supplied from the first air supply source 61 to the nozzle 62. Then, the air and the slurry are mixed in the nozzle 62 and mist slurry is sprayed from the nozzle 62 onto the part protruding from the wafer W in the polishing surface 76a of the polishing pad 76.

Conventionally, slurry has been supplied from a slurry supply source to a polishing unit at 100 mL/minute, for example. In contrast, because the supply rate of the slurry supplied by the first slurry supply source 63 is 30 mL/minute as described above, the slurry supply rate is smaller than the conventional supply rate.

The slurry sprayed in a mist form from the lower side onto the part protruding from the wafer W in the rotating polishing surface 76a rotates in such a manner as to accompany the rotating polishing pad 76. In addition, due to the flow of air from the opening 761 toward the outer circumference in the polishing surface direction of the polishing pad 76, the slurry passes on the grooves 760 and outside the grooves 760 to flow to the outer circumferential edge of the polishing surface 76a. Thus, the slurry spreads over the whole of the polishing surface 76a. Therefore, polishing is carried out in a state in which always the slurry exists at the contact part between the upper surface Wb of the wafer W and the polishing pad 76. Accordingly, it becomes possible to carry out proper polishing on the wafer W with a small amount of slurry, and economic polishing processing with suppression of the consumption of the slurry can be implemented.

In the present embodiment, the slurry continues to be sprayed from the mist slurry supply unit 6 to the polishing surface 76a of the polishing pad 76 continuously in the polishing processing. However, the slurry may be intermittently sprayed from the mist slurry supply unit 6 to the polishing surface 76a of the polishing pad 76 in the polishing processing. When the mist slurry is intermittently sprayed, for example, the mist slurry is sprayed from the nozzle 62 for three seconds and subsequently the spraying of the mist slurry is stopped for three seconds. Repeating this can reduce the amount of slurry used.

While the supply of the slurry like that described above is carried out, the thickness of the wafer W is measured by the thickness measurement unit 19, so that the wafer W is polished to a desired thickness. Specifically, the light projecting part 190 of the thickness measurement unit 19 irradiates the wafer W positioned below the thickness measurement unit 19 with measurement light. The measurement light is converted to collimated light parallel to the Z-axis direction by the collimator lens 191 and is transmitted through the transmissive plate 835 of the shutting member 83 to pass through the through-hole 834 and the penetrating path 78 and reach the wafer W. Then, the thickness measurement unit 19 calculates the optical path difference when the light receiving part 192 receives each of reflected light arising from reflection by the upper surface Wb of the wafer W and reflected light arising from reflection by the lower surface Wa of the wafer W after the collimated light is transmitted through the wafer W, and the thickness of the wafer W is measured.

When a large amount of slurry is supplied to the polishing pad 76 by using the penetrating path 78 as in the conventional technique, the measurement light of the thickness measurement unit 19 is blocked by the slurry in the penetrating path 78 and cannot reach the wafer W, so that the thickness measurement of the wafer W does not work in some cases. However, it becomes possible to surely carry out the thickness measurement of the wafer W by the thickness measurement unit 19 by, as described above, spraying and supplying mist slurry obtained by mixing slurry and air onto the part protruding from the wafer W in the polishing surface 76*a* of the polishing pad 76 by the mist slurry supply unit 6 without using the penetrating path 78 and supplying air to the penetrating path 78.

When the wafer W is polished to a desired thickness while the thickness measurement is carried out by the thickness measurement unit 19, the polishing feed mechanism 5 raises the polishing unit 7, and the polishing of the wafer W ends.

Figure 3:
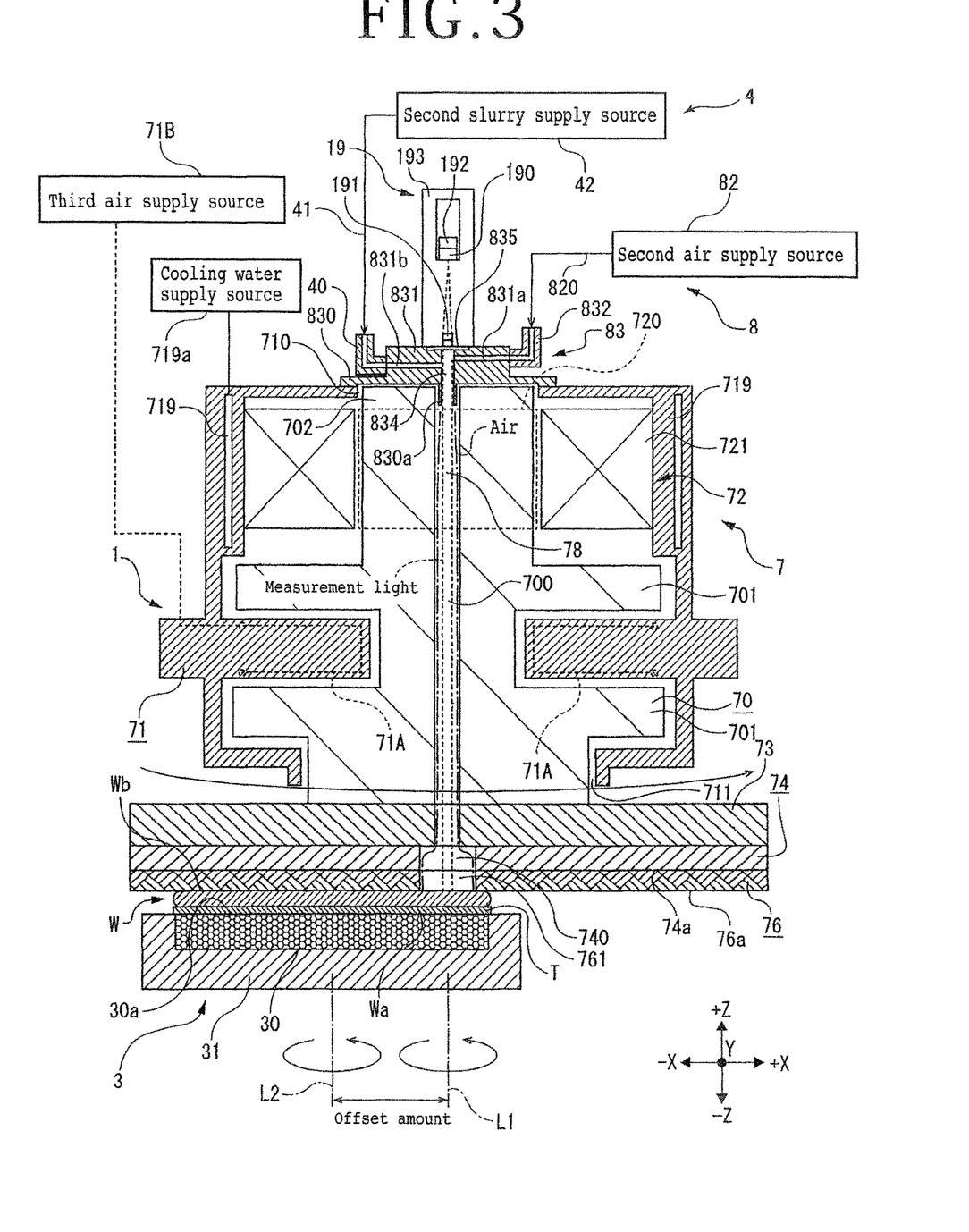
FIG. 3 is a sectional view illustrating one example of a polishing apparatus including a penetrating path slurry supply unit.

As the slurry supply unit that supplies slurry to the polishing surface 76*a* of the polishing pad 76, a penetrating path slurry supply unit 4 that is illustrated in FIG. 3 and supplies slurry to the penetrating path 78 may be employed instead of the mist slurry supply unit 6 illustrated in the above-described FIGS. 1 and 2.

In the polishing apparatus 1, when the penetrating path slurry supply unit 4 is employed as the slurry supply unit, a slurry introduction path 831*b* leading to the through-hole 834 is formed along the horizontal direction in the column part 831 and a second slurry supply source 42 communicates with this slurry introduction path 831*b* through a joint 40 and a conduit line 41.

As illustrated in FIG. 3, in polishing processing, the second slurry supply source 42 supplies slurry to the conduit line 41 at a predetermined supply rate (for example, 30 mL/minute) while air is supplied by the air supply unit 8. This slurry flows in the joint 40, the slurry introduction path 831*b*, the through-hole 834, and the penetrating path 78. The amount of slurry flowing in the penetrating path 78 is smaller than that in the conventional technique. Thus, the slurry receives the centrifugal force due to the rotation and flows downward along the inner wall of the spindle 70 and a passage through which the measurement light passes is ensured at the center of the penetrating path 78.

The slurry that has passed through the penetrating path 78 and reached the opening 761 of the polishing pad 76 passes on the grooves 760 and outside the grooves 760 and flows to the outer circumferential edge of the polishing surface 76*a* due to the centrifugal force of the polishing pad 76 and the flow of the air from the opening 761 toward the outer circumference in the polishing surface direction of the polishing pad 76. Thus, the slurry spreads over the whole of the polishing surface 76*a*, and polishing is carried out in the state in which always the slurry exists at the contact part between the upper surface Wb of the wafer W and the polishing pad 76. Therefore, it becomes possible to carry out proper polishing on the wafer W with a small amount of slurry, and economic polishing processing with suppression of the consumption of the slurry can also be achieved.

In order to efficiently spread the slurry over the polishing surface 76*a*, a chamfer or fillet may be formed at the connecting part between the penetrating path 78 and the polishing surface 76*a* (ridge line part of the opening 761).

While the supply of the slurry like that described above is carried out, the light projecting part 190 of the thickness measurement unit 19 irradiates the wafer W positioned below the thickness measurement unit 19 with measurement light. The measurement light is converted to collimated light parallel to the Z-axis direction by the collimator lens 191 and is transmitted through the transmissive plate 835 to pass through the through-hole 834 and the penetrating path 78 and reach the wafer W. Specifically, as described above, the amount of slurry flowing in the penetrating path 78 is smaller than that in the conventional technique and a passage through which the measurement light passes is ensured at the center of the penetrating path 78. Therefore, the measurement light reaches the wafer W without being blocked by the slurry, and the thickness measurement by the thickness measurement unit 19 is surely carried out.

Then, when the wafer W is polished to a desired thickness while the thickness measurement is carried out by the thickness measurement unit 19, the polishing feed mechanism 5 raises the polishing unit 7, and the polishing of the wafer W ends.

The polishing apparatus 1 according to the present invention is not limited to the above-described embodiment. Furthermore, the shape and so forth of each configuration of the apparatus illustrated in the accompanying drawings are also not limited thereto and can be changed as appropriate within a range in which effects of the present invention can be exerted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A polishing apparatus comprising:
   a holding table having a holding surface that holds a wafer;
   a polishing unit in which a polishing pad having an opening at a center of a polishing surface that polishes the wafer held by the holding table is mounted to a spindle and is rotated;
   a slurry supply unit that supplies slurry to the polishing surface of the polishing pad; and
   an air supply unit connected to an upper end of a penetrating path penetrating through an axial center of rotation of the polishing pad and the spindle and extending to the opening in the polishing surface, the air supply unit supplies air to the penetrating path to close the penetrating path to the flow of the slurry from the slurry supply unit, wherein
   the air supplied by the air supply unit is directed through the opening in the polishing pad and sprayed onto an upper surface of the wafer that closes the opening of the polishing pad through bringing the upper surface of the wafer held by the holding table into contact with the polishing surface of the polishing pad, and the wafer is polished in such a manner that the slurry supplied from the slurry supply unit is spread over a whole of the polishing surface due to a flow of the air in a radial manner from the opening toward an outer circumference in a polishing surface direction of the polishing pad.

2. The polishing apparatus according to claim 1, wherein the slurry supply unit is a mist slurry supply unit that sprays mist slurry obtained by mixing slurry and air onto a part protruding from the wafer in the polishing surface when the polishing pad with the polishing surface larger than the upper surface of the wafer is mounted to the spindle and the polishing surface is brought into contact with the upper surface of the wafer held by the holding surface.

3. The polishing apparatus according to claim 1, wherein the slurry supply unit is a penetrating path slurry supply unit that supplies slurry to the penetrating path.

4. The polishing apparatus according to claim 1, further comprising another slurry supply unit that supplies slurry to the polishing surface of the polishing pad.

5. The polishing apparatus according to claim 1, further comprising a thickness measurement unit including a light projecting part and a light receiving part, said thickness measurement unit configured to measure a thickness of the wafer.

6. The polishing apparatus according to claim 1, wherein the polishing pad includes grooves.

7. The polishing apparatus according to claim 6, wherein the grooves formed on the polishing pad are arranged in a lattice pattern.

\* \* \* \* \*